US006075470A

United States Patent [19]

Little et al.

[11] Patent Number: 6,075,470

[45] Date of Patent: Jun. 13, 2000

[54] BLOCK-WISE ADAPTIVE STATISTICAL DATA COMPRESSOR

[75] Inventors: Herb A. Little, Waterloo; Hugh R. Hind, Georgetown, both of Canada

[73] Assignee: Research In Motion Limited, Waterloo, Canada

[21] Appl. No.: 09/031,418

[22] Filed: Feb. 26, 1998

[51] Int. Cl.[7] ...................................................... H03M 7/00

[52] U.S. Cl. ............................................. 341/107; 341/106

[58] Field of Search ...................................... 341/106, 107

[56] References Cited

U.S. PATENT DOCUMENTS

| | | |
|---|---|---|
| 3,675,211 | 7/1972 | Raviv . |
| 3,675,212 | 7/1972 | Raviv et al. . |
| 3,694,813 | 9/1972 | Loh et al. . |
| 3,701,108 | 10/1972 | Loh et al. . |
| 3,717,851 | 2/1973 | Cocke et al. . |
| 4,121,259 | 10/1978 | Preuss et al. . |
| 4,386,416 | 5/1983 | Giltner et al. . |
| 4,506,325 | 3/1985 | Bennett et al. . |
| 4,516,246 | 5/1985 | Kenemuth . |
| 4,558,302 | 12/1985 | Welch . |
| 4,560,976 | 12/1985 | Finn . |
| 4,597,057 | 6/1986 | Snow . |
| 4,626,829 | 12/1986 | Hauck . |
| 4,701,745 | 10/1987 | Waterworth . |
| 4,706,264 | 11/1987 | Cung . |

(List continued on next page.)

FOREIGN PATENT DOCUMENTS

| | | |
|---|---|---|
| 0369689 | 5/1990 | European Pat. Off. . |

OTHER PUBLICATIONS

"A Block–sorting Lossless Data Compression Algorithm", Burrows, M. and Wheeler, D.J., SRC Research Report of Digital Systems Research Center, dated May 10, 1994.

"Data Compression with the Burrows–Wheeler Transform", Nelson, Mark, Dr. Dobb's Journal, Sep., 1996.

MNP Update No. 8, Mar. 30, 1987.

"Block Sorting Text Compression", Fenwick, Peter, Department of Computer Science, The University of Auckland.

"Experiments with a Block Sorting Text Compression Algorithm", Fenwick, Peter, Technical Report 111, ISSN 1173–3500, Department of Computer Science, The University of Auckland, May 17, 1995.

(List continued on next page.)

*Primary Examiner*—Brian Young
*Assistant Examiner*—Jason L W Kost
*Attorney, Agent, or Firm*—Jones, Day, Reavis & Pogue; Charles B. Meyer, Esq.

[57] ABSTRACT

A block-wise adaptive statistical data compressor is disclosed that operates by replacing characters in a data block with super-character codewords comprising a variable length prefix and a fixed length index. The codewords are determined by treating a plurality of groups of characters as super-character groups and then adapting the codewords, for each data block, based upon the actual frequency of occurrence of the characters in each group. The super-character prefix value identifies the group to which a particular character belongs, and the index value identifies the individual character of the group. By grouping and indexing the characters into these super-character groups, the present invention models a particular data block using a fraction of the information generally required by a fixed statistical compressor. Also disclosed are multi-stage lossless block data compressors that include the block-wise adaptive statistical compressor and also include a clustering stage and a reordering stage. The clustering stage clusters like characters into similar locations within the data block, and the reordering stage reorders the data to generate an expected skew in the frequency distribution of characters in the data block so that the block can be more efficiently compressed by the block-wise adaptive statistical compressor.

29 Claims, 8 Drawing Sheets

U.S. PATENT DOCUMENTS

| | | | |
|---|---|---|---|
| 4,862,167 | 8/1989 | Copeland, III . | |
| 4,881,075 | 11/1989 | Weng . | |
| 4,955,066 | 9/1990 | Notenboom . | |
| 4,988,998 | 1/1991 | O'Brien . | |
| 5,016,009 | 5/1991 | Whiting et al. . | |
| 5,049,881 | 9/1991 | Gibson et al. . | |
| 5,051,745 | 9/1991 | Katz . | |
| 5,109,433 | 4/1992 | Notenboom . | |
| 5,140,321 | 8/1992 | Jung . | |
| 5,684,478 | 11/1997 | Panaoussis | 341/51 |
| 5,717,393 | 2/1998 | Nakano et al. | 341/50 |
| 5,886,655 | 3/1999 | Rust | 341/107 |

OTHER PUBLICATIONS

"Improvements to the Block Sorting Text Compression Algorithm", Fenwick, Peter, Technical Report 120, ISSN 1173–3500, Department of Computer Science, The University of Auckland, Aug. 3, 1995.

"An Adaptive System For Data Compression", Faller, Newton, Proc. 7th Asilomar Conf. On Circuits, Systems & Computers (1973).

"Information Compression By Facotirising Common Strings", Mayne, A. and James, E.B.; The Computer Journal, vol. 18, No. 2 (Aug. 1973) (pp. 157–160).

"Automatic File Compression", McCarthy, J.P.; A. Günther et al (eds.), International Computing Symposium 1973(pp. 511–516).

"Text Compression Using A 4 Bit Coding Scheme", Pike J., The Computer Journal, vol. 24, No. 4, 1981 (pp. 324–330).

"Data Compression For a Source With Markov Characteristics", Llewellyn, J.A.; The Computer Journal, vol. 30, No. 2, 1987 (pp. 149–156).

"Data Compression", Lelewer, Debra A. and Hirschberg, Daniel S.; ACM Computing Surveys, vol. 19, No. 3, Sep. 1967 (pp. 261–296).

"Fast Pattern Matching In Strings", Knuth, Donald E., Morris, Jr., James H., and Pratt, Vaughan R.; Siam J. Comput., vol. 6, No. 2, Jun. 1977 (pp. 323–350).

"Dynamic Huffman Coding", Knuth, Donald E.; Journal of Algorithms 6 (1985) (pp. 163–180).

"Is Text Compression By Prefixes and Suffixes Practical?", Fraenkel, A.S., Mor, M. and Perl, Y.; Acta Informatica 20 (1983) (pp. 371–389).

"Text Compression Using Variable– To Fixed–Length Encodings", Cooper, David and Lynch, Michael F.; Journal of The American Society For Information Science (Jan. 1982) (pp. 18–31).

"A Locally Adaptive Data Compression Scheme", Bentley, Jon Louis, Sleator, Daniel D., Tarjan, Robert E., and Wei, Victor K.; Communications of the ACM, Apr. 1986, vol/ 29, No. 4 (pp. 320–330).

BLOCK-WISE ADAPTIVE STATISTICAL DATA COMPRESSOR

BACKGROUND OF THE INVENTION

The present invention is directed toward the field of data compression. In particular, a block-wise adaptive statistical data compressor is disclosed that adapts its data model on a block by block basis. The data model generated by the adaptive statistical data compressor consists of a plurality of super-character codewords that correspond to a plurality of super-character groups, wherein each super-character group contains data regarding the frequency of occurrence of one or more individual characters in an applicable character data set. The use of these super-character codewords and groups to model the data in a particular block minimizes the amount of model data that must be included with the compressed data block to enable decompression.

Also disclosed in this application is a preferred multi-stage data compressor that includes the block-wise adaptive statistical data compressor, as one stage, and also includes a clustering stage and a reordering stage, which, together, reformat the data in the data block so that the frequency distribution of characters in the data block has an expected skew. This skew can then be exploited by selecting certain super-character groupings that optimize the compression ratio achievable by the block-wise adaptive statistical stage. In an alternative embodiment, additional stages are added to the clustering, reordering and adaptive statistical stages to improve data compression efficiency.

The present invention finds particular use in data communication devices in which it is desirable to reduce the quantity of data transmitted while maintaining the integrity of the data stream. Although the disclosed data compressor (in its various embodiments) can be used for general data compression on a personal computer or workstation to compress, for example, data files for easier transport or electronic transmission, the preferred application of the data compressor is for use with mobile data communication devices that transmit packets (or blocks) of data, such as E-mail messages, via a wireless packet network. The data compressor is preferably implemented as a sequence of computer program instructions that are programmed into the mobile data communication device, but could, alternatively be implemented in hardware or as a sequence of instructions that are stored on a disk as an article of manufacture.

Data compression (or compression) refers to the process of transforming a data file or stream of data characters so that the number of bits needed to represent the transformed data is smaller than the number of bits needed to represent the original data. The reason that data files can be compressed is because of redundancy. The more redundant a particular file is, the more likely it is to be effectively compressed.

There are two general types of compression schemes, lossless and lossy. Lossless compression refers to a process in which the original data can be recovered (decompressed) exactly from the compressed data. Lossy compression refers to schemes where the decompressed data is not exactly the same as the original data. Lossless schemes are generally used for data files or messages where the content of the file must be accurately maintained, such as an E-mail message, word processing document, or other type of text file. Lossy schemes are generally used for data files that already include a certain degree of noise, such as photographs, music, or other analog signals that have been put into a digital format and therefore the addition of a bit more noise is acceptable.

The present invention is a lossless data compression scheme. In the field of lossless data compression there are two general types of compressors: (1) dictionary based (or sliding-window); and (2) statistical coders. Dictionary based compressors examine the input data stream and look for groups of symbols or characters that appear in a dictionary that is built using data that has already been compressed. If a match is found, the compressor outputs a single pointer or index into the dictionary instead of the group of characters. In this way, a group of characters can be replaced by a smaller index value. The main difference between the numerous dictionary based schemes is how the dictionary is built and maintained, and how matches are found. Well-known dictionary based schemes include LZ77 (where the dictionary is a fixed-length sliding window that corresponds to the previous N-bytes of data that have been compressed); LZ78 (where the dictionary is an unlimited-sized tree of phrases that are built as the data is being compressed); and various improvements on LZ77 and LZ78, including LZSS, LZW, and numerous other schemes that employ a "hash" function to find the position of a particular token in the dictionary.

Statistical coders are typically either Huffman coders or arithmetic coders. Statistical coders build a model of the data stream or block and then replace individual characters in the data block with a variable-length code that corresponds to the frequency of occurrence of the particular character in the data block. Huffman coding assigns variable-length codes to characters based on their frequency of occurrence. For example, in the English language the letters "E", "T", "A", "I", etc., appear much more frequently than the letters "X", "Q", "Z", etc., and Huffman coding takes advantage of this fact by assigning (for a fixed Huffman coder) a lower number of bits to letters that occur more frequently and a higher number of bits to characters that occur less frequently.

There are two basic types of Huffman coders, a fixed Huffman coder and a purely adaptive Huffman coder. The fixed coder builds a tree of codes based on statistics concerning all the symbols (or characters) actually contained in the data file. This "Huffman tree" must be passed to the decompression device in order to properly decompress the file, which adds to the overhead and thus reduces the effective compression ratio. For example, a fixed Huffman coder for 7-bit characters would normally require 128 bytes of data to model the character set, while for 8-bit characters, 256 bytes are normally required. Thus for small data blocks, on the order of several KB, the overhead of the fixed Huffman coder is undesirable.

The adaptive Huffman coder assumes an initial distribution of characters in the block, and then changes the coding of individual symbols in the tree based on the actual content of the symbols in the data file as they are being processed. The advantage of the adaptive coder is that the tree is not passed to the decompression device, but the decompression device must assume the initial distribution of symbols in the tree. The main problem with the adaptive stage is that it takes a certain amount of data to be processed before the model becomes efficient, and therefore it is also undesirable for small blocks of data.

Presently known dictionary based and statistical compressors suffer from several disadvantages that are addressed by the present invention. First, neither of these types of compressors are optimized for relatively small data blocks. In fact, some of these schemes exhibit poor performance for small blocks of data, as are commonly transmitted over wireless packet data networks.

The presently known dictionary based schemes can provide good compression ratios, but generally require a large amount of memory to operate in order to store the dictionary. This is particularly true of the LZ78 variants where the dictionary is not limited to any particular size. This is a problem for small mobile computers that have a limited memory capacity. In addition, these schemes require a search and replace function that can be computationally intensive and time consuming depending on the size of the dictionary, the data structure used to store the data in the dictionary, and the method employed to find a matching string. This is an additional problem for mobile computers that generally have limited processing power.

The presently known statistical compressors suffer from several disadvantages: (1) they generally do not provide enough compression; (2) the fixed type of coder requires the additional overhead of passing a code for each character in the alphabet to the decompressing device, thus reducing the overall compression ratio, particularly where a relatively small block of data is being compressed; (3) the purely adaptive type of coder requires a great deal of processing power on the compression side to constantly update the statistical model of the data stream, and therefore is not well suited for small, mobile data communication devices that have limited processing power; and (4) also with respect to the purely adaptive type of coder, this type of coder only becomes efficient after a particular amount of data has been compressed, and therefore it is very inefficient for small data blocks, where the compressor may require more data to become efficient than is contained in the block.

Therefore, there remains a general need in the art of data compression for a data compressor that is optimized to compress relatively small blocks of data.

There remains a more particular need for a data compressor that is optimized for use with mobile data communication devices that have limited memory and processing capabilities.

There remains still a more general need for a data compressor that adapts its data model to each data block that is being compressed, but at the same time minimizes the amount of model data that must be transmitted to the decompression device to decompress the block.

There remains a more particular need for such a data compressor that, while adapting to each block of data, minimizes the processing power required of the device operating the compressor and is efficient for relatively small data blocks.

There remains yet another need for a multi-stage data compressor that includes, as one stage, a block-wise adaptive statistical data compressor that satisfies the above-noted needs.

There remains an additional need for such a multi-stage data compressor that includes a clustering stage and a reordering stage for transforming each data block such that there tends to be an expected skew in the frequency distribution of characters in the data block.

There remains an additional need for such a multi-stage data compressor that includes additional compression stages, such as dictionary based or statistical coder stages, in order to increase the overall compression efficiency of the data compressor.

There remains an additional need for such a multi-stage data compressor in which the clustering stage utilizes the Burrows-Wheeler Transform ("BWT") and the reordering stage utilizes a move-to-the-front ("MTF") scheme.

SUMMARY OF THE INVENTION

The present invention overcomes the problems noted above and satisfies the needs in this field for an efficient data block compressor. In particular, the present invention introduces the concept of a block-wise adaptive statistical data compressor that is presently unknown in the field of data compression. The block-wise adaptive statistical compressor provides the advantages of the fixed and purely adaptive types of statistical compressors, while avoiding the disadvantages of both.

A block-wise adaptive statistical data compressor operates by replacing characters in a block of data with super-character codewords comprising a variable length prefix and a fixed length index. The prefix is determined by treating a plurality of groups of characters as super-character groups. The prefix and index codes for each super-character group are adapted for each data block that is processed by the compressor. The super-character prefix value identifies the group to which a particular character belongs, and the index value identifies the individual character of the group. These codes are determined and assigned to each super-character group based upon the actual frequency of occurrence of the characters in each group.

By grouping and indexing the characters into these super-character groupings, the present invention models a particular data block using a fraction of the information generally required by a fixed statistical compressor. This results in improved compression ratios over the fixed type of scheme, particularly for smaller data blocks. This technique also results in improved compression ratios over a purely adaptive scheme for small data blocks, since the adaptive schemes are generally inefficient for relatively small data blocks.

Also disclosed in the following Detailed Description are two types of multi-stage lossless data block compressors that include the block-wise adaptive statistical compressor. The preferred multi-stage compressor includes a clustering stage and a reordering stage. The purpose of the clustering stage, which preferably operates the Burrows-Wheeler Transform, is to cluster like characters into similar locations within the data block. The purpose of the reordering stage, which is preferably an MTF reordering stage, is to transform the character data into numerical values that tend to exhibit a skewed frequency distribution. For the preferred MTF stage, this skewed frequency distribution generally results in a frequency distribution that is monotonically decreasing as the numerical value increases. Knowledge of this skewed frequency distribution can be used by the block-wise adaptive statistical stage to achieve higher compression ratios.

The alternative multi-stage compressor includes two additional stages, a dictionary based preprocessing stage and a run-length encoder stage. The purpose of these stages is to increase the overall compression ratio of the compressor, and to deal with certain types of data blocks that may be difficult for the clustering stage to process.

The present invention provides many advantages over presently known data compression methods, particular when used with small data blocks as are generally used in wireless packet data networks, such as: (1) like a purely adaptive stage, the present invention modifies the codes to conform to the actual frequency of occurrence of the individual characters in a data block, but unlike a purely adaptive stage, the present invention avoids the inefficiencies of this type of stage because it does not require that a particular amount of data is processed before the model becomes efficient; (2) like a fixed stage, the present invention processes the characters in the block using their actual frequencies of occurrence, but unlike a fixed stage, the present invention avoids the need to pass a large amount of model data to describe the character frequencies; (3) the present invention utilizes several pre-compression stages to reformat the data in the data block so that it is optimally compressible by the block-wise adaptive statistical stage; (4) the present invention deals with certain types of data blocks that may not be efficiently processed by the pre-compression stages noted in (3); (5) the present invention provides good compression ratios, at a relatively high speed, and with little memory overhead; and (6) the present invention is optimized for compressing relatively small data blocks, as are commonly used in wireless packet networks.

These are just a few of the many advantages of the present invention, as described in more detail below. As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

The present invention satisfies the needs noted above as will become apparent from the following description when read in conjunction with the accompanying drawings wherein.

DETAILED DESCRIPTION OF THE DRAWINGS

Figure 1:
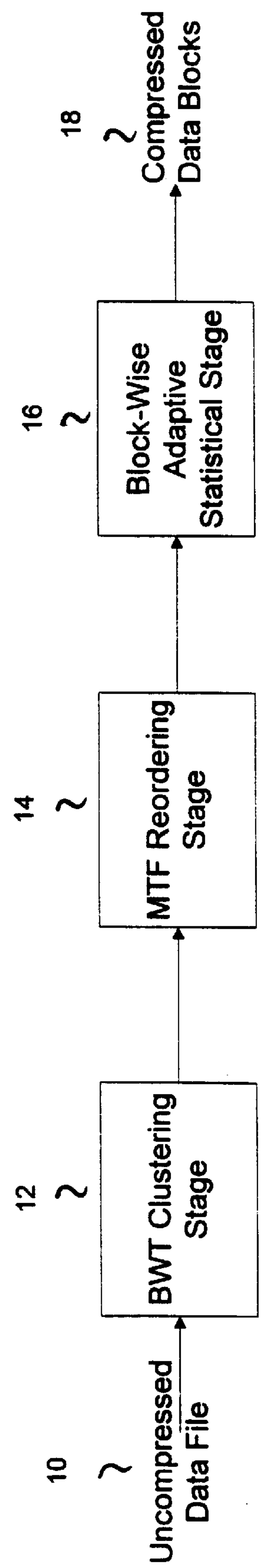
FIG. 1 is a block diagram of a preferred multi-stage lossless data compressor including a BWT clustering stage, an MTF reordering stage, and a block-wise adaptive statistical stage.

Referring now to the drawings, FIG. 1 is a block diagram of a preferred multi-stage lossless data compressor including a Burrows-Wheeler Transform ("BWT") clustering stage 12, a Move-To-Front ("MTF") reordering stage 14, and a block-wise adaptive statistical stage 16.

Although not shown explicitly in FIG. 1, an uncompressed data file 10 is first broken into blocks of some particular size, preferably from 512 to 4096 bytes, but could, alternatively, be partitioned into any other size block. Each block is then transformed by the clustering stage 12 and the reordering stage 14 prior to being compressed by the block-wise adaptive statistical stage 16, resulting in a sequence of compressed data blocks 18.

As will be described in more detail below, the clustering stage 12 provides the function of grouping or clustering similar characters in adjacent locations within the data block. The clustering stage 12 does not segregate all of a particular character in a particular location within the block, but, instead, segregates particular characters in several sub-blocks within the data block. For example, a typical sequence of characters in the clustered data block could be "ttTwWtttwwTTWww."

The preferred clustering stage employs the Burrows-Wheeler Transform, described in more detail below with respect to FIG. 3. The BWT algorithm is specifically described in "A Block Sorting Lossless Data Compression Algorithm," SRC Research Report, May 1994, by M. Burrows and D. J. Wheeler, and also in "Data Compression with the Burrows-Wheeler Transform," Dr. Dobb's Journal, September, 1996, by Mark Nelson, both of which are incorporated herein by reference. The BWT algorithm provides the desired function of transforming the data block so that similar characters are clustered together in certain locations of the block. Although the BWT algorithm is the preferred method of clustering characters in the data blocks, other techniques could be used that provide the desired function noted above.

Once the data has been rearranged by the clustering stage 12, it is passed to the reordering stage 14, which replaces the character data in the data block with a set of numerical values that tend to have a skewed frequency distribution. As described in more detail below with respect to FIG. 4, these numerical values correspond to the current position of a character being processed in a queue of all the characters in the associated character lexicon. The position of any character in the queue changes based upon the frequency of occurrence of that character, with frequently occurring characters appearing at the top of the queue where the index value is a small number The net result of the reordering stage 14 is that the rearranged data block of characters output by the BTW clustering stage 12 is replaced by a reordered block of numbers that are characterized by an expected frequency distribution that is skewed such that low numbers are significantly more likely to appear in the data block than high numbers. In the preferred MTF stage, the expected frequency distribution skew is a monotonically decreasing function, such that, ideally, there may be 50% zeros, 15% ones, 5% twos, 2% threes, 0.5% fours, . . . , 0.01% sixty-fours, etc. Although these first two stages 12, 14 are not required to practice the present invention, they are particularly useful in essentially pre-formatting the data into a block tending to have a particular skewed frequency distribution, which enables the block-wise adaptive statistical compressor 16 to more efficiently compress data.

After the data block has been clustered and reordered it is ready for compression. The block-wise adaptive statistical stage 16 of the present invention provides for an optimal level of compression while at the same time minimizing processing time and memory requirements. The block-wise adaptive statistical stage 16, described in more detail below in FIGS. 5A and 5B, replaces the characters output by the reordering stage 14 with a super-character codeword comprising a variable length Huffman prefix, followed by a fixed length index. The Huffman prefix is determined by treating a plurality of groups of characters as super-character groups. The prefix and index codes for each super-character group are adapted for each data block that is processed by the compressor. The super-character prefix value identifies the group to which a particular character belongs, and the index identifies the individual character of the group. These codes are determined and assigned to each super-character group based upon the actual frequency of occurrence of the characters in each group.

By forming these super-character groups and then calculating the super-character codewords, the present invention is capable of modeling a data block using a fraction of the amount of data required for a fixed Huffman compressor. This is a significant advantage for block data compressors where the data block is relatively small, such as a few KB. Although the preferred statistical compressor 16 uses the Huffman methodology, this stage could, alternatively, use other types of statistical coding techniques.

Using this super-character technique, and by adapting the groupings for each block of data, the present invention combines the advantages of a purely adaptive statistical compressor, e.g., the ability to modify the codes to conform to the actual frequency of occurrence of characters in the data file, with the advantages a fixed statistical compressor, e.g., the ability to process the characters using their actual frequency of occurrence. At the same time, the block-wise adaptive statistical compressor 16 avoids the disadvantages of the adaptive statistical compressor, e.g., inefficiency due to less than optimal initialization of the coding model, and the disadvantages of the fixed compressor, e.g., the need to pass a large table of frequencies of occurrence.

Although the present invention could be used with any type of data file and with any type of computer system, the preferred implementation of the block-wise adaptive statistical compressor 16, and the multi-stage compressor that also includes the clustering 12 and reordering stages 14, is for compressing E-mail messages to/from a mobile data communication device that communicates via a wireless packet network, such as a two-way paging computer, a wirelessly-enabled palmtop computer, a laptop having a wireless data modem, or any other type of portable device that communicates via a wireless packet data network.

The various stages noted above, and described in more detail in the numerous flowcharts below, are preferably carried out by software instructions programmed into the computer that is performing the data compression functions. The code-level detail of these software instructions, whether implemented as subroutines, modules, classes, hierarchies or functions, could be programmed by one of ordinary skill in the art having the teaching, description and diagrams of the present application.

These computer software instructions are preferably loaded onto a computer or other programmable apparatus (such as a mobile data communication device as described above) to create a machine, so that the instructions that execute on the computer create means for implementing the functions specified in the block diagrams or flowcharts included with this application. Alternatively, the instructions may be stored in a computer-readable memory that can direct a computer or other programmable apparatus to function in a particular manner, such that the instructions stored in the computer-readable memory produce an article of manufacture including instruction means that implement the function specified in the block diagrams or flowcharts. The computer software instructions may also be loaded onto a computer or other programmable apparatus to cause a series of operational steps to be performed on the computer to produce a computer-implemented process such that the instructions that execute on the computer provide steps for implementing the functions specified in the block diagrams or flowcharts.

Figure 2:
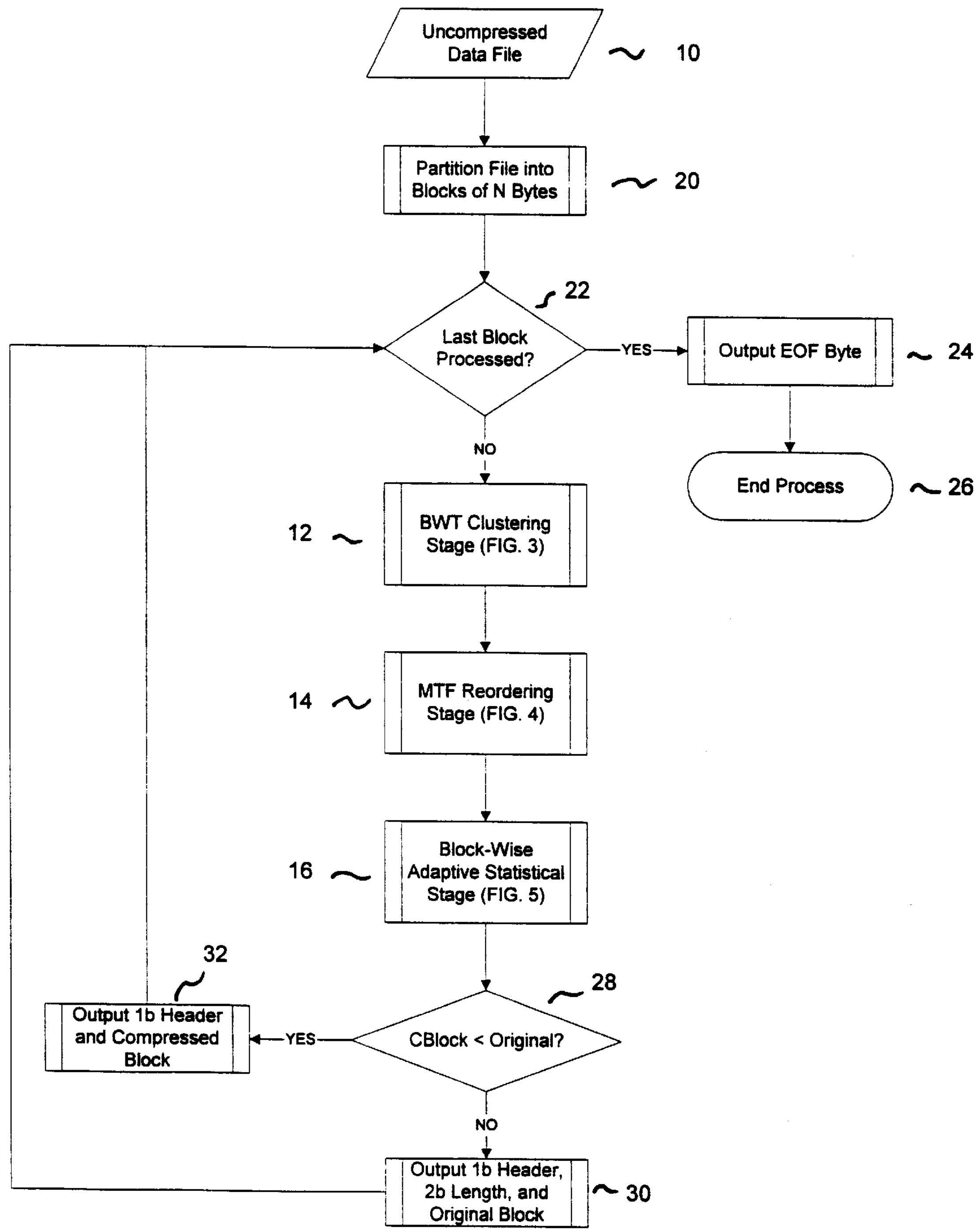
FIG. 2 is a flow chart showing the method of compressing data using the preferred multi-stage lossless data compressor of FIG. 1.

Referring now to FIG. 2, a flow chart showing the computer-implemented method of compressing data using the preferred multi-stage lossless data block compressor of FIG. 1 is set forth. Three stages are included in this figure, the BWT clustering stage 12, the MTF reordering stage 14, and the block-wise adaptive statistical stage 16.

The compression method begins with an uncompressed data file 10. At step 20, this data file 10 is partitioned into data blocks of N bytes each. In the preferred embodiment, N is 4096 bytes, but could, alternatively be another block size. The choice of block size depends on the desired compression ratio (i.e., the size of the file and associated decompression information divided by the size of the original file), the memory capabilities of the device that is executing the computer-implemented method steps, and the size of the packets associated with the packet network, if the method is being used on a device that is communicating via such a network.

At step 22, the algorithm determines whether the last data block in the file has been processed, and if so, outputs an EOF (end-of-file) byte and the method ends. If the last block has not been processed, then control passes to step 12, where the BWT clustering stage transforms the data block as described above, and as discussed more fully below in connection with FIG. 3. Following the BWT clustering transformation, control passes to step 14, where the MTF reordering stage reorders the clustered data block as described above, and as discussed more fully below in connection with FIG. 4. The net effect of the clustering 12 and reordering steps 14 is that the transformed and reordered data block is characterized by an expected skew in the frequency distribution of characters in the data block. This effect, although not required to practice the present invention, allows optimization of the super-character groupings and codewords generated by the block-wise adaptive statistical compressor, thus resulting in better compression ratios.

After the block has been compressed by the block-wise adaptive statistical stage 16, as described above, and discussed more fully below in connection with FIGS. 5A and 5B, control passes to step 28, where the algorithm determines whether the compressed block ("CBlock") is smaller than the original block. There are certain data files that are not compressible, and in this case control passes to step 30, in which the method outputs a 1-byte header, a 2-byte block length, and then outputs the original data block. If, at step 28, it is determined that the compressed block is smaller than the original, then at step 32 a 1-byte header is output along with the compressed block. From steps 30 or 32, control then passes back to step 22, which determines whether additional data blocks remain to be processed.

Figure 3:
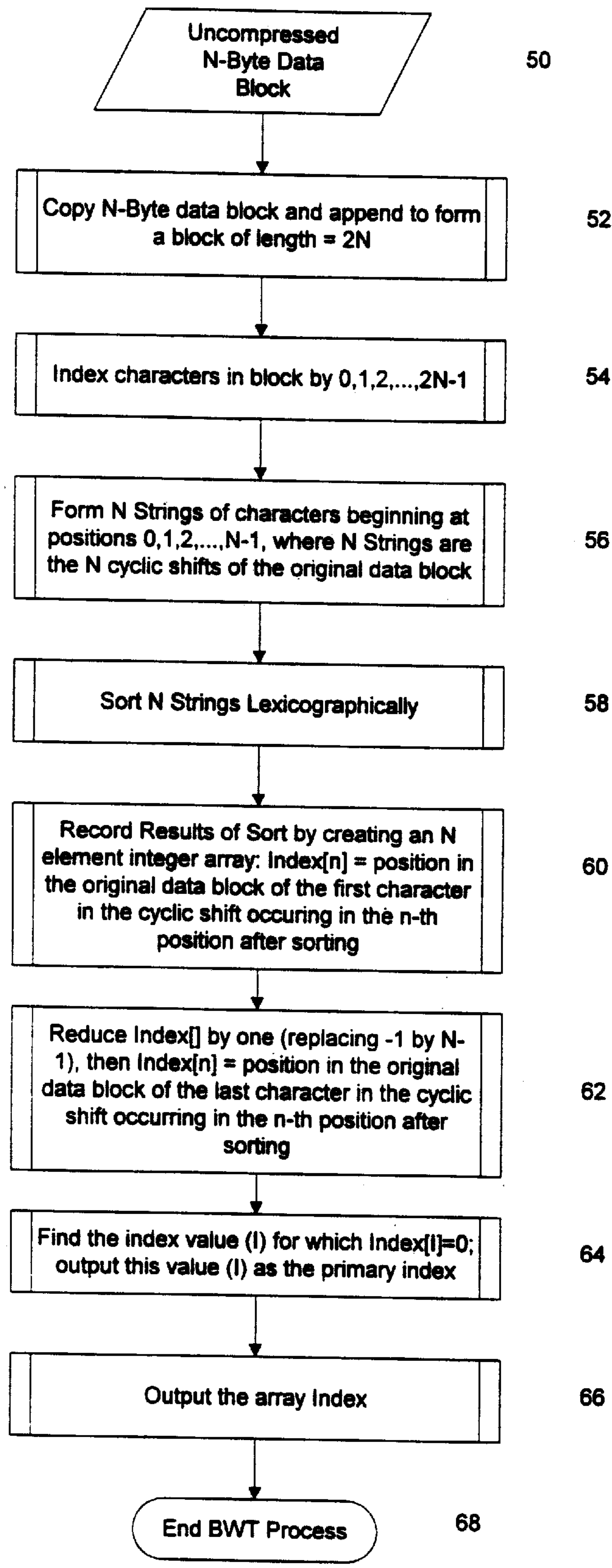
FIG. 3 is a flow chart showing the operation of the BWT clustering stage.

FIG. 3 is a flow chart showing the computer-implemented steps carried out by the clustering stage 12, which, in the preferred multi-stage data compressor, is a stage that utilizes the Burrows-Wheeler Transform. The BWT clustering stage 12 transforms the characters in the data block so that like characters are grouped or clustered together in certain subblocks within the data block. In other words, a single character will tend to occur with a high probability in a small number of locations in the transformed data block and will occur with a low probability in the other locations.

Before describing the computer-implemented method steps of the BWT clustering stage 12, it is important to understand the terms "lexicographic order", "cyclic shift", and "primary index." The term "lexicographic order" refers to the ordering used in creating a dictionary. In the BWT clustering stage 12, the data in the data block is viewed as a plurality of strings of characters, and the strings are each assigned a numeric value. To lexicographically order two strings in the data block, the first characters in each string are compared. If the characters are identical, then compare the second characters in each string, and continue if the second characters are identical to compare the third, fourth, . . . , and Nth characters until two non-identical characters are encountered. When this occurs, the string with the character having the smaller value is placed first in the lexicographic ordering.

For example, using ASCII values for the characters in the strings, if the strings "B78Q64" and "B78MT3" are compared, the determination of lexicographic order is based on the fourth characters, "Q" and "M". This is because each string contains the initial three characters "B78." Since "M" has an ASCII value that is less than "Q", the string "B78MT3" would be placed before string "B78Q64" in the lexicographic order.

The term "cyclic shift", when referring to a string of characters contained in the data block, refers to a string of the same length as the original in which each character in the string of characters is moved a fixed number of positions to the left or right. Characters that are shifted beyond the ends of the string are wrapped around to the other side, as in a circular buffer. For it; example, given the string of characters "ABCDEFG", a cyclic shift to the left by five positions results in the string "FGABCDE".

In the preferred implementation of the clustering algorithm described below, this cyclic shifting step can be carried out by first copying a string of length N onto itself, thus creating a string of length 2N. So that, for example, the string "ABCDEFG" would become "ABCDEFGABCDEFG". A cyclic shift to the left by "k" positions of the original string is then simply a substring of the concatenated string, and therefore a rotation of the original string is not required, which reduces the processing time of the algorithm.

The term "primary index" is an integer value that is output along with the clustered data block. The primary index provides the location in the clustered data block of the last character of the original (unclustered) block. The decompression device uses this location information to reverse the clustering transformation. For more information on the declustering operation, refer to the previously mentioned SRC Research Report by Burrows and Wheeler, as well as the article in Dr. Dobbs journal by Mark Nelson.

Turning now to the BWT clustering method shown in FIG. 3, at step 50 the uncompressed N-byte data block is provided to the computer-implemented algorithm. At step 52 the N-byte data block is copied and appended to itself, resulting in a data block of length 2N. Control then passes to step 54 which indexes the characters in the data block using the numerical values 0, 1, . . . , 2N−1 Following the indexing step 54, control passes to step 56, which forms N strings of characters beginning at the index positions 0, 1, . . . , N−1, in which the N strings represent N cyclic shifts of the original data block. Control passes to step 58 which performs the above-described lexicographical sort of the N strings. At step 60, the results of the lexicographical sort carried out in step 58 are stored in an N-element integer array labeled Index[ ], where each entry in the array represents the position in the original data block of the first character in the cyclic shift occurring in the N-th position after sorting. Following the reordering step, control passes to step 62, in which the values in Index[ ] are reduced by one (with −1 being replaced by N−1), which results in the values stored in Index[n] representing the position in the original data block of the last character in the n-th position after sorting. Control then passes to step 64, where the index value (I) for which Index[I]=0 is then found and output as the primary index. At step 66 the array Index is output and the process ends at step 68.

Figure 4:
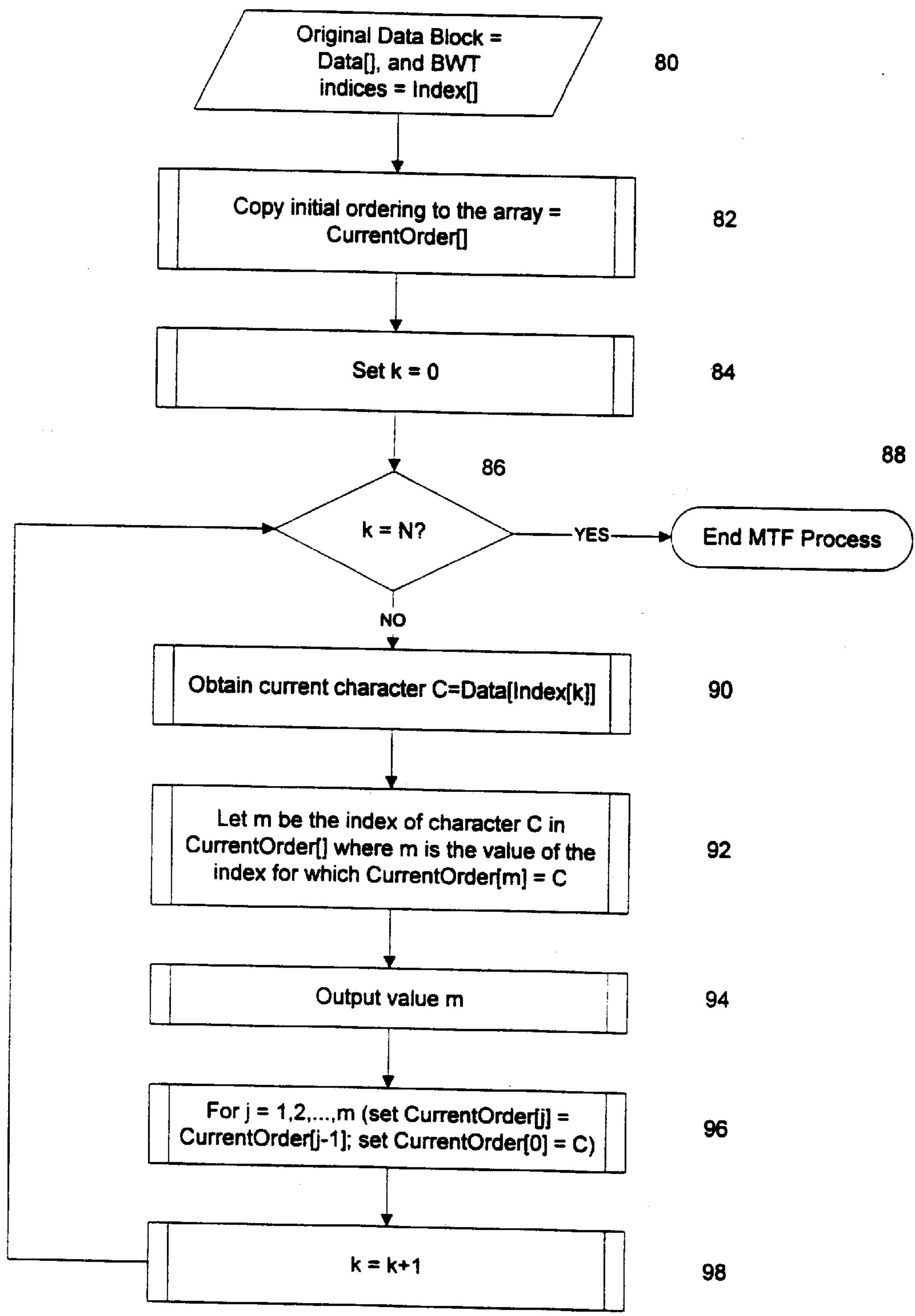
FIG. 4 is a flow chart showing the operation of the MTF reordering stage.
Figure 5A:
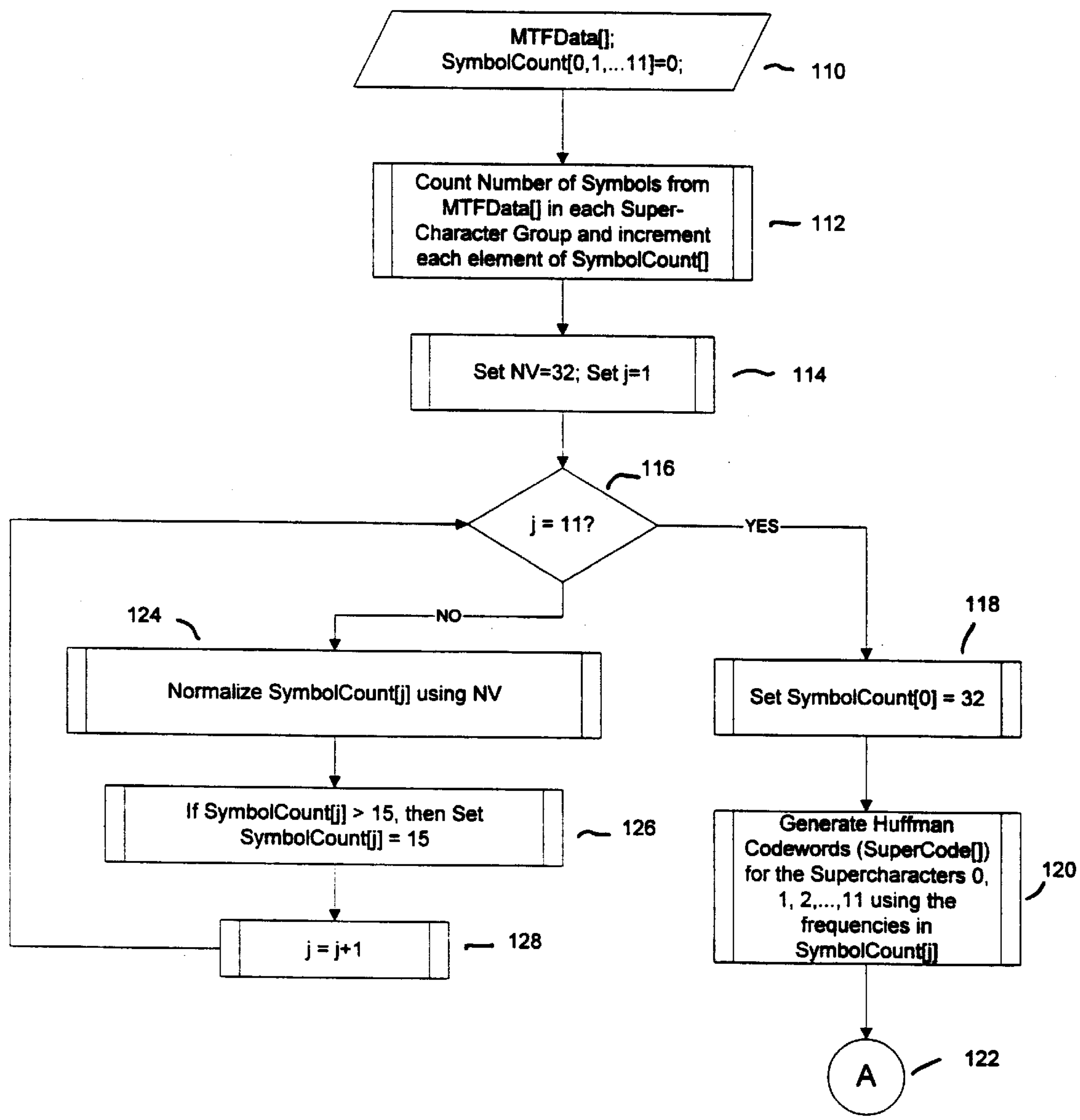
FIGS. 5A and 5B are flow charts showing the operation of the block-wise adaptive statistical compression stage.

The following example data demonstrates the effect of the clustering stage (this example will be continued when describing the reordering and compression stages in FIGS. 4, 5A, and 5G.) Set forth is an original text message (A), the input to the BWT clustering stage (shown as HEX ASCII values over the corresponding text) (B), and the clustering stage output (listing the primary index (C), and the array Index data (D), along with the corresponding output viewed as HEX ASCII values (E) and as characters (F)).

(A) Original message:

This message contains roughly two hundred characters and is designed to illustrate the performance of the RIM compression algorithm. Since the message is very short the compression ratio is not representative.

(B) Input to BWT algorithm:

54 68 69 73 20 6D 65 73 73 61 67 65 20 63 6F 6E 74 61 69 6E 73 20 72 6F 75 67 6C

This message contains rougl 79 20 74 77 6F 20 68 75 6E 64 72 65 64 20 63 68 61 72 61 63 74 65 72 73 20 61 6E y two hundred characters an 64 20 69 73 20 64 65 73 69 67 6E 65 64 20 74 6F 0D 0A 69 6C 6C 75 73 74 72 61 74 d is designed to illustrat 65 20 74 68 65 20 70 65 72 66 6F 72 6D 61 6E 63 65 20 6F 66 20 74 68 65 20 52 49 e the performance of the RI 4D 20 63 6F 6D 70 72 65 73 73 69 6F 6E 20 61 6C 67 6F 72 69 74 68 6D 2E 20 53 69

M compression algorithm. Si 6E 63 65 20 74 68 65 0D 0A 6D 65 73 73 61 67 65 20 69 73 20 76 65 72 79 20 73 68 nce the message is very sh 6F 72 74 20 74 68 65 20 63 6F 6D 70 72 65 73 73 69 6F 6E 20 72 61 74 69 6F 20 69 ort the compression ratio I 73 20 6E 6F 74 20 72 65 70 72 65 73 65 6E 74 61 74 69 76 65 2E s not representative.

(C) Primary index: 97

(D) Data (these values are hexadecimal indices into the message array):

46 8E 45 8D 68 83 78 32 27 6C A8 0B 39 1F 36 BA 96 03BD 61 55 B4 C1 14 9E 89 64 A4 51 42 1B 99 82 D0 6A 6B 69 84 D1 2C 08 93 10 79 5D 33 2A 4E B6 CB 5F 87 28 6D A9 0C 2D 26 35 41 3A 23 8C 67 A7 0A 95 60 54 88 50 CF 25 40 C8 C3 57 2F 9B C6 3B 05 90 72 AE 63 59 09 94 18 3E 7B 29 8B 66 A6 53 00 80 A0 20 3D 47 85 11 B8 75 B1 37 01 BB 97 7E CD 7A 48 49 19 81 5C 04 8F 6F AB 77 B3 5E 86 34 22 3F BE 12 0E C9 44 1E B9 62 6E AA 76 B2 0D 7C 5A A1 BF 16 56 C4 70 AC 2B 4D B5 24 C2 C5 71 AD 58 7D 5B 15 30 A2 9C 31 38 02 BC 13 98 07 92 C7 9F 3C 74 B0 06 91 73 AF 4B C0 A3 0F CA 4F 2E 8A 65 A5 52 7F B7 CC 43 4C 1C 17 21 4A CE 9A 1D 9D 1A (E) Output viewed as hexadecimal ASCII values:

0D 0D 6F 65 65 2E 6E 73 64 4D 65 65 73 6F 64 6F 65 73 73 65 65 6E 74 73 79 65 66 74 65 64 79 73 6D 65 52 49 20 20 2E 72 73 73 74 20 6D 20 68 72 72 74 6E 6E 20 20 20 20 61 65 6E 65 20 6E 68 68 68 67 67 63 68 63 74 76 72 6E 73 72 70 74 76 72 64 6D 6D 72 72 6F 72 61 61 75 69 6C 63 74 74 74 74 54 74 73 20 73 0A 53 61 74 73 73 20 68 20 20 72 74 61 69 6C 67 68 72 20 0A 6F 6F 6F 6F 61 69 61

75 67 20 69 6F 65 74 77 69 20 63 63 69 69 63 67 66 68 6E 72 20 65 6D 6D 61 74 20 64 20 70 70 70 65 6F 6F 20 65 6F 65 72 69 69 69 6E 69 73 73 65 20 65 73 73 65 65 65 65 75 6F 72 6E 6E 61 63 20 20 20 20 69 61 61 20 73 20 6F 68 6C 69 20 74 72 6C each position in the array having a numeric index value from 0 to A−1, where A is the total number of characters in the alphabet. The preferred pre-ordering of the queue that is optimized for small text messages in the English language is as follows:

' ', 'e', 't', 'n', 'o', 'a', 'i', 'r', 's', 'l', 'd', 'c', 'p', OxOa, 'h', 'u',
'm', 'g', ',' , 'w', 'f', 'y', '.', 'v', 'I', 'b', 'C', 'M', 'S', '9', 'k', 'A',
'P', '1', 'D', 'R', 'T', 'E', 'W', 'x', '(', ')', '7', 'B', '5', 'N', '−' , 'H',
'U', '"', ' :' , ' \" , '0', ' /' , '2', '3', '6', 'F', '4', 'L', 'O', '8', '+' , 'J',
'K', 'Z', ' @' , 'G', 'z', '?' , 'V', 'Y', 'j', 'q', '!' , '#', '$', '%', ' &', '*',
';' , ' <' , ' =' , ' >' , 'Q', 'X', '[', '\ \', ']', '^' , '_', ''', '{', ' | ' , '}', ' ~' , etc.

(F) Output viewed as characters:

. . . oee.nsdMeesodoesseentsyeftedysmeRI .rsst m
hrrtnnaenenhhhggchctvrnsrptvrdmmrroraauilcttttTts s.Satss
h rtailghr .ooooaiaug ioetwi cciicgfhnr emmat d pppe
oo eoeriiinisse esseeeeuornnac iaa s ohli tri An examination of the example output characters (F) compared to the input characters (A) demonstrates the clustering effect of the BWT transform. As can be seen in (F), similar characters have been clustered together in certain locations within the block.

Using the BWT clustering stage is particularly advantageous for mobile data communication devices that are communicating via a wireless packet data network due to the asymmetry of operation of this algorithm, and the realities of data traffic to and from the mobile device. The clustering algorithm discussed above is relatively processor-intensive as compared to the corresponding de-clustering side, which operates very fast. This asymmetry occurs because the clustering algorithm must conduct the lexicographical sorting operation whereas the de-clustering side does not conduct this step. This asymmetrical operation matches well with mobile data communication devices that are generally receiving (and thus decompressing) relatively large data files, and are generally transmitting (and thus compressing) relatively small data files. So, the burden of the lexicographical sort is largely borne by workstations that have much more processing capability than the typical mobile device.

Referring now to FIG. 4, a flow chart showing the computer-implemented steps carried out by the MTF reordering stage 14 is set forth. The MTF reordering stage 14 converts the output from the BWT clustering stage 12 into a format in which characters with low numeric value occur significantly more often than characters with high numeric value. This is accomplished by exploiting the effect of clustering similar characters in similar locations that is provided by the BWT clustering stage 12.

The MTF reordering stage operates by first creating a queue of characters that are included in the alphabet of characters (or lexicon) being used by the device operating the data compression method. For example, in English speaking countries the queue would consist of the normal ASCII character set. If the device is used in other countries or with different languages, other queues of characters could be used. In addition, by pre-ordering the characters in the queue based on an to initial expected frequency of occurrence, the compression ratio is improved. The queue is thus an array of characters in the alphabet being used, with As described in more detail below, the MTF reordering stage 14 operates by converting the characters in the clustered data block into numerical values based on the current position of the particular character in the queue of characters. For each character, the MTF reordering stage finds its current position in the queue. This value is output in place of the character and the particular character is then moved to position 0 of the queue. So, if the next character is the same as the one just processed, the output of the reordering stage will be a zero.

Consider the following example queue (which has not been pre-ordered), "abcdefg . . . ". In this queue, the letter "a" is in position 0, the letter "b" is in position "1", etc. If the first character in the clustered data block is a letter "c", then the MTF reordering algorithm outputs a "3", the current position of the letter "c" in the queue, and then moves the letter "c" to the front of the queue, which now looks like this: "cabdefg . . . ". If the second character processed is a "b", then the MIF reordering stage outputs another "3", since "b" is now in position "3" of the queue, and "b" is moved to the front of the queue.

Because the BWT clustering stage 12 clumps like characters together, the net result of the MTF reordering operation is an output stream that includes a large number of very low numbers, such as zero, one, two, and a few larger numbers. This expected skew in the frequency distribution of data in the data block can be exploited by the block-wise adaptive statistical compressor to more efficiently compress the data block.

Beginning at step 80 in FIG. 4, the original data block of N characters, Data[ ], and the indices produced by the BWT clustering stage 12, Index[ ], are provided to the MTF reordering algorithm. The initial ordering of the characters in the queue are then input to an A-element array labeled CurrentOrder[ ] at step 82, where A represents the total number of characters in the applicable alphabet. As previously discussed, the initial ordering could be preset so that characters that are likely to occur more frequently in, for example, a text message, are initialized to positions in the queue near the front. In addition, different types of alphabets could be used depending on the location of the device that is executing the computer-implemented instructions. So, for example, a mobile data communication device that is in the United States may use the ASCII alphabet with a particular pre-sort based on the frequency of occurrence of certain characters in the English language, whereas a device in Germany or Japan could use an alternative alphabet with another pre-sort based on the specifics of the language being used. Of course, in this situation, the receiving device that is performing the corresponding decompression steps would need to know this presort information in order to properly decode the compressed data blocks.

At step 84 the index variable k is set equal to zero. Step 86 determines whether the value of k is equal to N, and if so, the MTF reordering process ends at step 88. If k is not equal to N, than at step 90, the method obtains the current character from the input data block, which is equal to Data[Index[k]]. Control then passes to step 92, where the process determines the position of to the current character in the array CurrentOrder[ ], which is labeled "m". This value is output at step 94. Control then passes to step 96, which reorders the queue CurrentOrder[ ] by moving the current character to the front of the queue and shifting the characters previously in front of the current character by one position towards the position previously occupied by the current character. At step 98 the index value k is incremented, and control then passes back to step 86, which determines if there are additional characters to process. If so, the process repeats until each of the N characters is replaced by the numerical index values based on the current position of the character in the queue.

Continuing the example from FIG. 3, set forth below is the output data block from the clustering stage (G), which is input to the reordering stage, and the reordered output (H). These values are shown as HEX numbers to demonstrate the effect of the reordering stage. A quick examination of these two data sets demonstrates that the MTF reordering stage replaces the relatively high HEX ASCII values from the clustering stage with numbers that are mostly zeros, ones, twos or other relatively low numbers, with the number of zeros being substantially greater than the numbers of ones, which are substantially greater than the numbers of twos, etc., revealing the monotonically decreasing effect of the clustering and reordering stages that is desired.

(G) Input to reordering stage viewed as hexadecimal ASCII values:

0D 0D 6F 65 65 2E 6E 73 64 4D 65 65 73 6F 64 6F 65 73 73 65 65 6E 74 73 79 65 66 74 65 64 79 73 6D 65 52 49 20 20 2E 72 73 73 74 20 6D 20 68 72 72 74 6E 6E 20 20 20 20 61 65 6E 65 20 6E 68 68 68 67 67 63 68 63 74 76 72 6E 73 72 70 74 76 72 64 6D 6D 72 72 6F 72 61 61 75 69 6C 63 74 74 74 74 54 74 73 20 73 0A 53 61 74 73 73 20 68 20 20 72 74 61 69 6C 67 68 72 20 0A 6F 6F 6F 6F 61 69 61 75 67 20 69 6F 65 74 77 69 20 63 63 69 69 63 67 66 68 6E 72 20 65 6D 6D 61 74 20 64 20 70 70 70 65 6F 6F 20 65 6F 65 72 69 69 69 6E 69 73 73 65 20 65 73 73 65 65 65 65 75 6F 72 6E 6E 61 63 20 20 20 20 69 61 61 20 73 20 6F 68 6C 69 20 74 72 6C (H) Actual output from Move-to-the-front scheme (these values are hexadecimal from 0 to FF):

6C 00 05 03 00 17 06 0A 0C 1C 05 00 03 06 04 01 03 03 00 01 00 05 09 03 18 04 18 04 02 07 04 05 15 04 24 1B 0E 00 0D 11 07 00 0A 04 08 01 16 05 00 04 0D 00 04 00 00 00 11 0B 03 01 03 02 06 00 00 18 00 15 02 01 07 1B 09 06 0B 02 17 05 05 03 11 0D 00 02 00 13 01 0E 00 19 17 18 0D 0A 00 00 00 25 01 0D 11 01 1A 1F 0A 05 04 00 05 12 01 00 0C 04 05 0B 0B 13 07 06 07 0A 0E 00 00 00 08 08 01 0E 08 06 04 05 14 0B 1D 04 05 10 00 02 00 01 07 1A 0D 16 0E 07 0A 13 00 0E 0C 04 14 01 16 00 00 06 0F 00 03 02 02 01 08 0E 00 00 0A 01 13 00 04 06 01 02 00 01 00 00 00 11 07 07 07 00 0B 10 08 00 00 00 09 03 00 02 09 01 07 0E 13 06 04 0E 0A 04

Figure 5B:
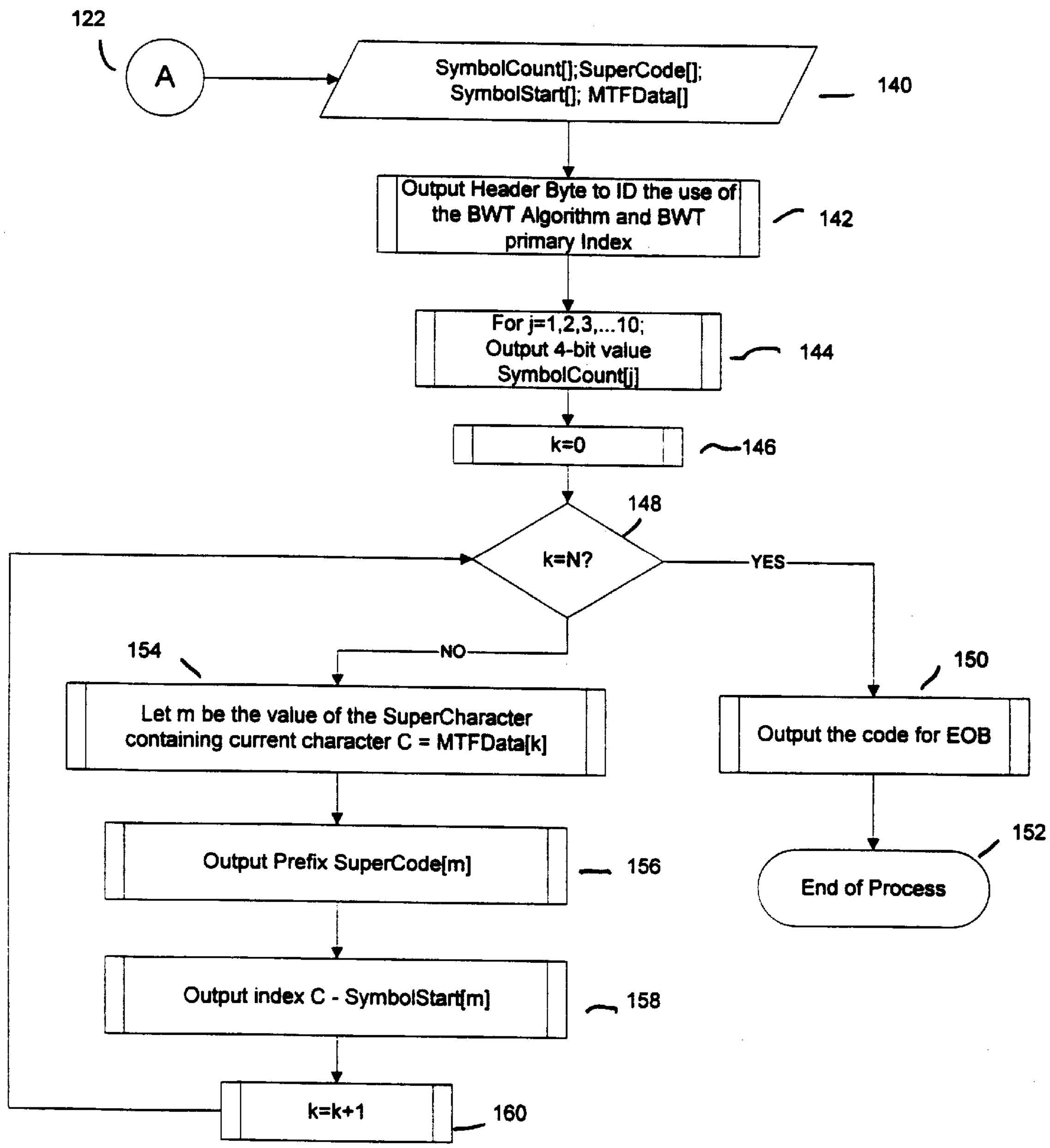

FIGS. 5A and 5B are flow charts showing the computer-implemented steps of the block-wise adaptive statistical compressor 16 of the present invention. FIG. 5A sets forth the steps to generate the super-character codewords that adaptively model the characters in each data block, and FIG. 5B sets forth the steps to compress the data block using the super-character codewords generated in FIG. 5A.

The block-wise adaptive statistical compression stage 16 is adaptive in that for each data block a new set of super-character groupings and codewords are generated. The technique for generating super-character codewords and then using these codewords to compress the data, block by block, enables the present invention to avoid the disadvantages of both fixed and purely adaptive statistical compressors, while at the same time having the advantages of both.

By adapting the super-character groups and codewords in a block-wise fashion, the present invention provides the main advantage of a purely adaptive statistical stage (the ability to modify the code to fit the actual frequency of occurrence of characters in a data set), without the processing overhead involved with continually updating the data model. It also avoids the main disadvantage of a purely adaptive stage, particularly for smaller data blocks, which is that it takes a certain number of characters to be processed before the purely adaptive stage becomes an efficient compressor. By forming the super-character groups and codewords, the present invention provides the advantage of a fixed compressor (actual correspondence between the frequency of occupance of characters in the data set and the data model), while at the same time maximizing compression ratio, particularly for smaller data blocks, by transmitting a fraction of the amount of data required to accurately model the data for a typical fixed compressor. Although the preferred coding technique disclosed is a Huffman coder, other types of compression coding techniques could be utilized with the method and compressor of the present invention.

The block-wise adaptive statistical compression stage 16 replaces each character output from the reordering stage 14 with a super-character codeword consisting of a variable length Huffman prefix, followed by a fixed length index value. The super-character prefix identifies the super-character group to which the character belongs, and the index identifies the individual character in the group. In the preferred embodiment of the invention there are eleven (11) super-character groups, although, alternatively, there could be less than or more than this number, with a maximum of A where A is the size of the alphabet (set of characters), in which case the entire scheme reverts to a fixed Huffman compressor. Set forth below is a table that describes the preferred eleven super-character groups for 8-bit ASCII characters.

| Super-Character | 0 | 1 | 2 | 3 | 4 | 5 | 6 | 7 | 8 | 9 | 10 |
|---|---|---|---|---|---|---|---|---|---|---|---|
| Width | 1 | 1 | 2 | 2 | 4 | 4 | 8 | 8 | 16 | 32 | 178 |
| Character | 0 | 1 | 2–3 | 4–5 | 6–9 | 10–13 | 14–21 | 22–29 | 30–45 | 46–77 | 78–255 |

-continued

| Super-Character | 0 | 1 | 2 | 3 | 4 | 5 | 6 | 7 | 8 | 9 | 10 |
|---|---|---|---|---|---|---|---|---|---|---|---|
| Index Bits | 0 | 0 | 1 | 1 | 2 | 2 | 3 | 3 | 4 | 5 | 8 |
| Symbol Start | 0 | 1 | 2 | 4 | 6 | 10 | 14 | 22 | 30 | 46 | 78 |

The first row of the table contains the label for the super-character groups, which are 0 through 10. The second row contains the number of characters that are grouped together to form the super-character. The third row contains the actual values of the characters that make up the super-character, and the fourth row lists the number of index bits that are required to identify a character in the particular group. As noted above, although this is the preferred grouping of characters, the present invention is not limited to any particular number of super-character groups, number of characters in a group, or number of index bits.

Super-character "0" preferably contains only the single character "0". Because of the expected skew in the frequency distribution of characters in the data block created by the clustering and reordering stages, it is probable that there are at least twice the number of zeros as ones. So, in order to minimize the amount of data transfer to model a particular data block, the symbol count in super-character group zero is set to a particular value, and the rest of the groups are normalized to this value. The preferred normalization value (NV) is 32, which makes it likely that the remaining groups 1–10 can be described with 4 or fewer bits (since it is probable that the normalized values in these groups will be less than 16). In addition, by picking a normalization value for the first group, model data regarding this group does not need to be transmitted to the decompressor, since it would be programmed to know that the count in group zero is the normalization value, thereby further minimizing the amount of model data.

FIG. 5A demonstrates the generation of the block-wise super-character groups. The purpose of generating these super-characters is so that the present invention can minimize the amount of data needed to be transmitted to the decompression device to model the data block. In a typical fixed Huffman coder for 8-bit characters, 256 bytes would be transmitted to the decompression device to model the data. For a data block that includes only several KB, this results in a major loss of compression efficiency. The method described in FIG. 5A is capable of modelling the data in the data block using only a few bytes.

Beginning at step 110, the data block from the MTF reordering stage 14, represented as an N-element array MTFData[ ], is provided to the block-wise adaptive stage 16. In addition, at step 110, an array of eleven bins or groups which correspond to the eleven super-characters in the table above is initialized to zero, labelled SymbolCount[ ]. Control initiates at step 112, where the algorithm counts the number of characters from MTFData[ ] in each group and for each character belonging to group j, the value stored in SymbolCount[j] is incremented by one. This step accumulates statistics on the number of characters in each super-character group.

Control then passes to step 114, which begins the normalization process by setting the normalization value (NV) to 32 and setting the value of an index j to 1. As long as j is not equal to 11, steps 116–124–126–128 are repeated, which normalize the super-character groups based on the normalization value set in step 114. Note that although 32 has been chosen as the preferred normalization value, other values could also be used. Assuming j is not 11, control passes to steps 124 and 126, which, as noted in the figure, normalize the data in a particular group using the set normalizing value. The index j is incremented at step 128, and control passes back to step 116. If there are more super-character groups to normalize, the process continues. Once j is set to 11, the normalization process is over, and the first super-character group, SymbolCount[0] is set equal to 32, the normalization value. As indicated above, this normalization process, while not required to practice the present invention, further minimizes model data overhead.

Finally at step 120 the super-character codewords are generated, including the variable length Huffman prefix and the index values. These super-character codewords are generated for each of the preferred eleven super-character groups set forth in the table above, using the frequencies calculated in the array SymbolCount[ ]. Once the super-character codewords have been adaptively generated for the data block, control passes to FIG. 5B, via connector A 122.

FIG. 5B is a flow chart setting forth the remainder of the computer-implemented steps carried out by the block-wise adaptive statistical compression stage 16 to actually compress the data block. The algorithm described in FIG. 5A generated normalized frequencies of occurrence for the eleven super-character groups in the array SymbolCount[ ], and also generated the super-character codewords for the super-character groups, which are stored in the eleven element array SuperCode[ ]. Also provided to the compressor is the clustered and reordered data block from the MTF stage 14, labelled MTFData[ ], and an eleven element array SymbolStart[ ], which contains the value of the first character included in the corresponding super-character. These items are provided to the algorithm at step 140.

At step 142 the compressor outputs an initial header byte to identify that it is using the clustering BWT algorithm 12, with the block size specified by the upper nibble, and it also outputs the primary index from the BWT stage. At step 144, the normalized frequencies of occurrence for the super-character groups contained in SymbolCount[ ] are output. This initial data is required by the decompression algorithm to decompress the data block. Although not shown specifically for any of the stages in the preferred multi-stage compressor, the corresponding decompression routines would be easily understood by one of ordinary skill in the art of computer software and data compression by understanding the compression algorithms set forth.

At step 146, an index value k is set to zero. Then, for each character in the clustered and reordered data block MTFData[ ], the steps 154–156–158–160 are repeated until each character is replaced by its corresponding super-character prefix and index value. Assuming k is not equal to N, control passes to step 154 which sets the variable "C" equal to MTFData[k], and sets the variable "m" equal to the super-character codeword in SuperCode[ ] that the current character MTFData[k] belongs to. At step 156 the Huffman variable length prefix for SuperCode[m] is output, and then at step 158 the index for the specific character (C-SymbolStart[m]) is output. Control passes to step 160, which increments k to point to the next character in MTFData[k], and control returns to step 148, which determines if there are additional characters to compress. If so, steps 154–160 repeat until k=N, at which point the entire data block has been replaced by the corresponding super-character prefix and character index. Control then passes to step 150 where an end-of-block (EOB) code is output, and the compression stage ends at 152.

Continuing the example started in FIGS. 3 and 4, set forth below is the input data block MTFData[ ] output from the MTF reordering stage 14 (I), and the output from the block-wise adaptive statistical compression stage 16, consisting of the BWT clustering algorithm identifier (J), the primary index from the BWT stage (K), the normalized frequencies of occurrence of the Huffman codes (L), the actual compressed data (M), and the end of block identifier (N).

(1) Output from Move-to-the-front scheme (these values are hexadecimal from 0 to FF):

6C 00 05 03 00 17 06 0A 0C 1C 05 00 03 06 04 01 03 03 00 01 00 05 09 03 18 04 18 04 02 07 04 05 15 04 24 1B 0E 00 0D 11 07 00 0A 04 08 01 16 05 00 04 0D 00 04 00 00 00 11 0B 03 01 03 02 06 00 00 18 00 15 02 01 07 1B 09 06 0B 02 17 05 05 03 11 0D 00 02 00 13 01 0E 00 19 17 18 0D 0A 00 00 00 25 01 0D 11 01 1A 1F 0A 05 04 00 05 12 01 00 0C 04 05 0B 0B 13 07 06 07 0A 0E 00 00 00 08 08 01 0E 08 06 04 05 14 0B 1D 04 05 10 00 02 00 01 07 1A 0D 16 0E 07 0A 13 00 0E 0C 04 14 01 16 00 00 06 0F 00 03 02 02 01 08 0E 00 00 0A 01 13 00 04 06 01 02 00 01 00 00 00 11 07 07 07 00 0B 10 08 00 00 00 09 03 00 02 09 01 07 0E 13 06 04 0E 0A 04

(J) BWT algorithm identifier: CA (K) Primary index as a 16 byte integer: 00 61

(L) 5 bytes containing the Huffman code frequencies of occurrence

FC FF FF 2C 10

(M) Actual compressed data as bytes

F2 3D 1E DF 20 63 BF 8E D0 17 6E DD 18 F7 E8 BE 8B 02 46 B9 7A DF A8 4F 4C 33 08 5D F0 71 3E 2A 93 6E F6 E0 2B EA 5F 38 3F A3 03 73 E4 CF 53 7D 92 BC 85 F7 F3 F4 F6 55 EB F3 D3 EF CF 45 86 51 A9 D3 88 DA D5 42 00 B1 0A 84 2E 40 40 23 59 BF E4 69 59 70 7F 1F F0 80 58 AC 83 89 6E F8 A0 23 6E 67 09 0A 67 2B 10 3B 2E A9 30 84 33 52 15 43 DB 07 C1 41 50 12 0C 2F 36 40

(N) End of message identifier: 10

The total number of bytes output from the multi-stage compressor in this example is 131 bytes, which corresponds to a compression ratio of about 0.65, meaning that the compressed file is 65% of the size of the original file.

Figure 6:
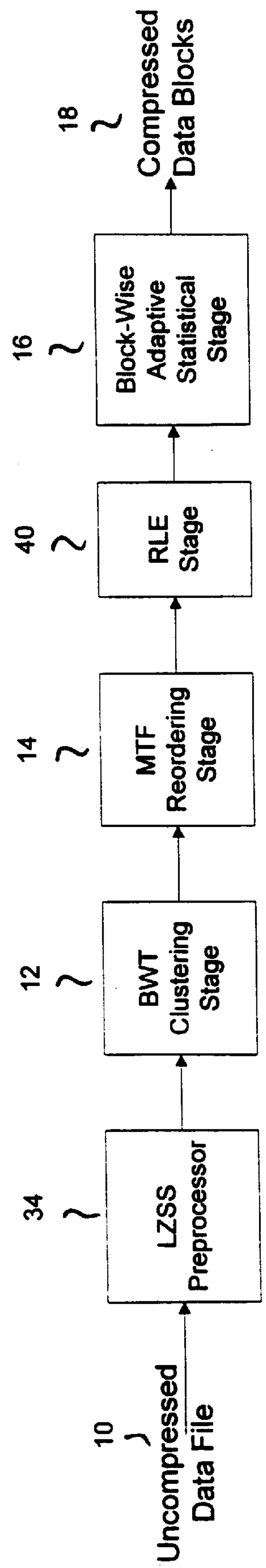
FIG. 6 is a block diagram of an alternative multi-stage lossless data compressor having the same stages as the preferred compressor of FIG. 1, and also including a sliding-window compression stage and a run-length encoder compression stage.

Turning now to FIG. 6, a block diagram of an alternative multi-stage lossless data block compressor is set forth having the same stages as shown in the preferred multi-stage compressor of FIG. 1, but also including a sliding-window dictionary based pre-processing stage 34, and a run-length encoder (RLE) compression stage 40.

The dictionary based compression stage is preferably an LZSS stage, but could, alternatively, be another type of dictionary based compressor. The purpose of the LZSS pre-processing stage 34 is to deal with certain types of data blocks that are extremely compressible, and which may be difficult for the BWT clustering stage to process. For example, consider a data block consisting of 4096 identical characters. Such a block can be compressed to a very small size using a dictionary based compressor. In addition, it would be very time consuming for the BWT clustering stage 12 to process such a block because the lexicographical sort would be very inefficient. Thus, as shown in FIG. 7, if the LZSS stage 34 can compress the incoming data block by a particular amount, there is no need to try and further compress the block using the rest of the multi-stage compressor.

Also included in the alternative multi-stage compressor of FIG. 6 is an RLE encoder 40 between the MTF reordering stage 14 and the block-wise adaptive statistical compressor 16. This optional stage provides an improvement in compression ratio in the situation where the output of the BWT clustering stage 12 is a long string of identical characters, which is then converted to a long string of zeros by the MTF reordering stage 14. Run-length encoders are particularly efficient for compressing long strings of identical characters, and therefore this stage 40 can improve the overall compression ratio when used with the clustering and reordering stages 12 and 14.

Figure 7:
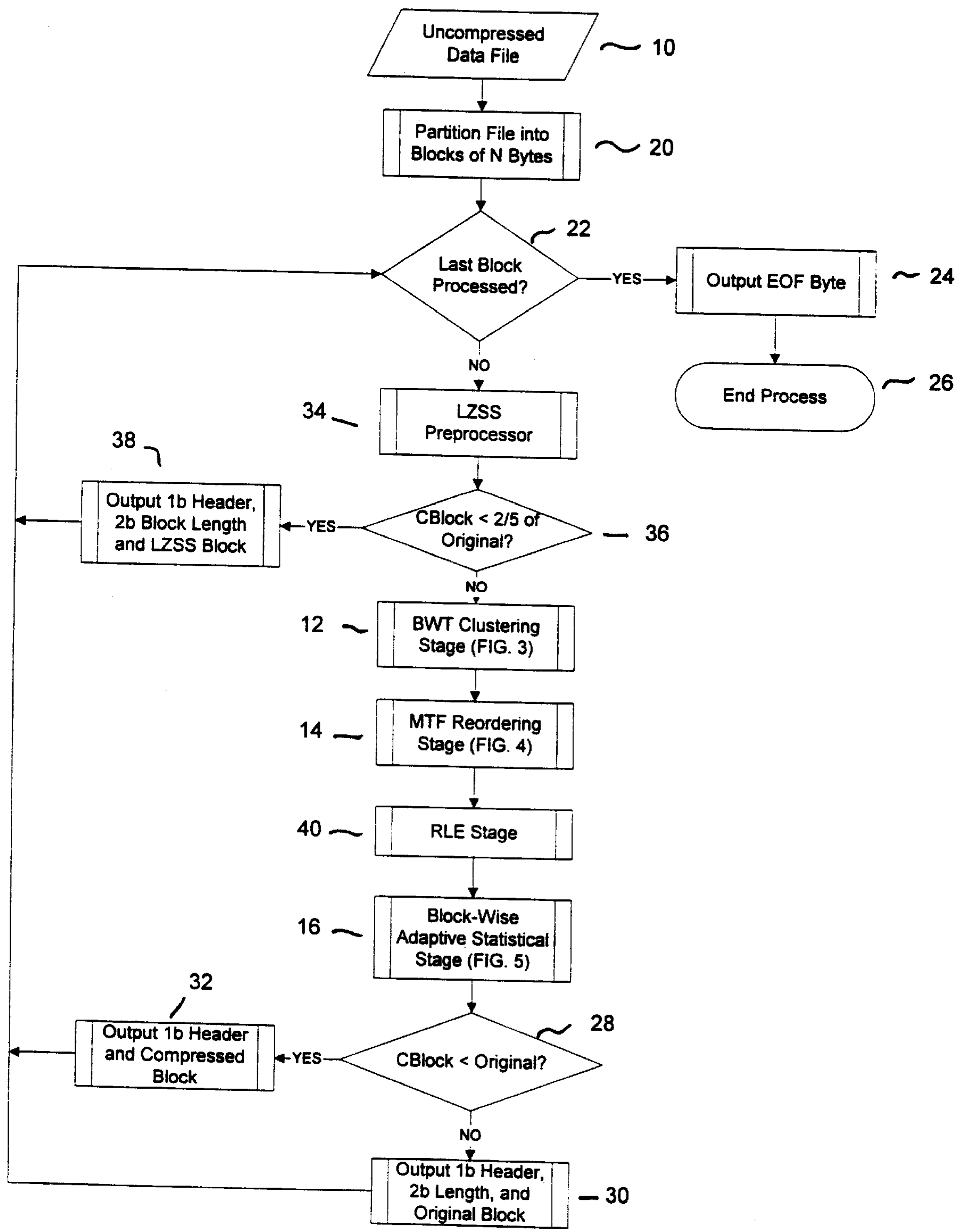
FIG. 7 is a flow chart showing the method of compressing data using the alternative multi-stage lossless data compressor of FIG. 6

FIG. 7 sets forth a flow chart of the computer-implemented steps carried out by a device executing the alternative steps of the multi-stage compressor shown in FIG. 6. The steps in FIG. 7 are mostly the same as in FIG. 2, with the addition of steps 34, 36, 38 and 40.

The uncompressed data file 10 is first partitioned into blocks at step 20, as described above with respect to FIG. 2. At step 22, the algorithm determines if the last block has been processed, and if so, an EOF byte is output and the compression process is complete. If not, then the data block is passed to the sliding window compressor, which as noted above, is preferably an LZSS stage, but which could, alternatively, be another type of dictionary-based compression scheme. If the LZSS stage compresses the block to 40% of its original size, than the algorithm assumes that this is sufficient compression, and outputs a 1-byte header, a 2-byte block length, and the output tokens from the LZSS compression stage. This 40% ratio could be any other ratio that is IS considered to be satisfactory compression for the particular application.

If the LZSS stage did not meet the 40% threshold at step 36, then the block is passed, in sequence, to the BTW clustering stage 12, the MTF reordering stage 14, the RLE stage 40, and finally the block-wise adaptive statistical stage 16. After being processed by these stages, as described above in FIGS. 3, 4, 5A and 5B, the method determines whether the compressed block ("CBlock") is smaller in size than the original uncompressed block at step 28. If not, than the algorithm outputs a 1-byte header, a 2-byte block length and the original data block, at step 30. If, however, the compressed block is smaller than the original, then the algorithm outputs a 1-byte header and the compressed block, as described above with reference to FIG. 5B. In either case, control passes back to block 22 and any additional blocks are likewise compressed.

Having described in detail the preferred embodiments of the present invention, including the preferred methods of operation, it is to be understood that this operation could be carried out with different elements and steps. These preferred embodiments are presented only by way of example and are not meant to limit the scope of the present invention which is defined by the following claims.

What is claimed:

1. A method of compressing data blocks having a plurality of characters, wherein the plurality of characters form an alphabet of N characters, comprising the steps of:

assigning the N characters of the alphabet into M super-character groups based upon the expected frequency of occurrence of each of the N characters in the data block, wherein M is less than N;

accumulating statistics in the M super-character groups regarding the frequency of occurrence of each character in the data block;

generating a plurality of super-character codewords that model the frequencies of occurrence for each character, wherein each super-character codeword includes a variable length prefix value that identifies the super-character group and a fixed length index value that identifies the particular character in the group; and replacing the characters with the super-character codewords to form a compressed data block.

2. The method of claim 1, wherein the assignment of characters to particular super-character groups results in certain super-characters being assigned a low number of frequently occurring characters and other super-characters being assigned a high number of infrequently occurring characters.

3. The method of claim 1, wherein the super-character codewords are Huffman codes.

4. The method of claim 1, further including the step of:

normalizing the accumulated statistics to a predetermined value.

5. A block-wise adaptive statistical compressor for compressing a data block having a plurality of characters, the plurality of characters forming an alphabet of N characters comprising:

means for assigning the N characters to M super-character groups based upon the expected frequency of occurrence for each character, wherein M is less than N;

means for accumulating statistics in the super-character groups regarding the frequency of occurrence of each character in the data block;

means for generating a plurality of super-character codewords that model the frequencies of occurrence for each character; and means for replacing the characters with the super-character codewords to form a compressed data block.

6. The block-wise adaptive statistical compressor of claim 5, wherein the super-character codewords include a variable length prefix that identifies the super-character group to which a particular character has been assigned, and a fixed index that identifies the particular character in the group.

7. The block-wise adaptive statistical compressor of claim 6, wherein the super-character codewords are provided to a decompression device along with the compressed data block to enable decompression.

8. The block-wise adaptive statistical compressor of claim 5, wherein the means for assigning characters to particular super-character groups assigns a low number of frequently occurring characters to particular super-character groups and a high number of infrequently occurring characters to other super-character groups.

9. The block-wise adaptive statistical compressor of claim 5, wherein the compressor is programmed into a mobile data communication device.

10. The block-wise adaptive statistical compressor of claim 9, wherein the mobile data communication device communicates via a packet data network.

11. The block-wise adaptive statistical compressor of claim 9, wherein the compressor is permanently stored within the memory of the mobile data communication device.

12. The block-wise adaptive statistical compressor of claim 9, wherein the mobile data communication device is a two-way paging computer.

13. A multi-stage data compressor for compressing a data file, comprising:

means for partitioning the data file into blocks of characters;

a clustering stage for transforming each data block into a clustered block;

a reordering stage for reordering each clustered block into a reordered block; and a block-wise adaptive statistical data compressor for compressing the reordered blocks of data, comprising:

means for assigning the characters to a plurality of super-character groups based upon the expected frequency of occurrence for each character, wherein at least one of the super-character groups is assigned a plurality of characters;

means for accumulating statistics in the super-character groups regarding the frequency of occurrence of each character in the data block;

means for generating a plurality of super-character codewords that model the frequencies of occurrence for each character; and means for replacing the characters with the super-character codewords to form a compressed data block.

14. The multi-stage data compressor of claim 13, wherein the reordering stage is a move to the front reordering stage.

15. The multi-stage data compressor of claim 14, wherein the move to the front reordering stage replaces the individual characters in the data block with numerical values having a skewed frequency distribution.

16. The multi-stage data compressor of claim 15, wherein the move to the front reordering stage comprises:

means for providing an initial queue containing an alphabet of available characters, each character being assigned a numerical value that corresponds to its order in the queue; and for each character in the clustered data block, means for replacing each character in the clustered block with the current numerical value of the particular character in the queue and for moving the particular character to the front of the queue.

17. The multi-stage data compressor of claim 16, wherein the initial queue is preordered with an alphabet of characters based on the projected frequency of occurrence of the characters in the clustered data block.

18. The multi-stage data compressor of claim 13, wherein the compressor is programmed into a mobile data communication device.

19. The multi-stage data compressor of claim 18, wherein the mobile data communication device communicates via a packet data network.

20. The multi-stage data compressor of claim 18, wherein the compressor is permanently stored within the memory of the mobile data communication device.

21. The multi-stage data compressor of claim 18, wherein the mobile data communication device is a two-way paging computer.

22. The multi-stage data compressor of claim 13, wherein the super-character codewords include a variable length prefix that identifies the super-character group to which a particular character has been assigned, and a fixed index that identifies the particular character in the group.

23. The multi-stage data compressor of 13, wherein the means for assigning characters to particular super-character groups assigns a low number of frequently occurring characters to particular super-character groups and a high number of infrequently occurring characters to other super-character groups.

24. The multi-stage data compressor of claim 22, wherein the super-character codewords are provided to a decompression device along with the compressed data block to enable decompression.

25. The multi-stage data compressor of claim 13, wherein the clustering stage utilizes the Burrows-Wheeler transform to transform the data characters in a data block so that like characters are clustered together in certain locations of the data block, thereby forming the clustered block.

26. A method of compressing a data file comprising the steps of:

partitioning the data file into a plurality of data blocks, wherein each data block includes a plurality of characters;

clustering the characters in the data block so that similar characters are grouped together within the block;

reordering the data block by replacing the characters with N numerical values having a skewed frequency distribution; and adaptively compressing each data block by accumulating the numerical values into M super-character groups, wherein M is less than N, and the N numerical values are assigned to the M super-character groups based upon their expected frequency of occurrence in the data block, and generating super-character codewords that replace the numerical values in order to compress the data block.

27. The method of claim 26, wherein tile super-character codewords include a variable length prefix value that identifies the particular super-character group to which the numerical value is assigned and a fixed length index that identifies the particular numerical value within the super-character group.

28. A method of compressing a data file, comprising:

partitioning the data file into data blocks containing N bytes;

for each data block in the data file:

clustering the N bytes in the data block using a clustering algorithm;

reordering the N bytes of data in the clustered data block;

adaptively compressing the reordered data block using a statistically coder;

determining whether the adaptively compressed data block is smaller than the original data block; and if the adaptively compressed data block is smaller than the original data block, then outputting a header byte indicating that the data block is compressed along with the compressed data block, else outputting a header byte indicating that the data block is not compressed along with the original data block.

29. A method of compressing a data block comprising a plurality of characters, wherein the plurality of characters are associated with an alphabet of N characters, comprising the steps of:

forming a super-character counting array having M elements, wherein each element of the super-character counting array is a super-character group associated with one or more characters in the alphabet, and wherein M is less than N;

accumulating statistics in the super-character counting array regarding the frequency of occurrence of the characters in the data block by incrementing the elements in the array based on the occurrence of a particular character in the data block that is associated with a particular super-character group;

selecting a normalization value for one of the elements in the array and normalizing the other elements in the array based on the normalization value;

generating super-character codewords for each character associated with the super-character groups by selecting a variable length prefix value and a fixed length index value for each character, wherein the length of the variable length prefix value when combined with the length of the fixed length index value is less than the length of an uncompressed character; and compressing the data block by replacing the characters with the super-character codewords.

* * * * *